US006184579B1

(12) United States Patent
Sasov

(10) Patent No.: US 6,184,579 B1
(45) Date of Patent: Feb. 6, 2001

(54) DOUBLE-SIDED ELECTRONIC DEVICE

(75) Inventor: Yuriy Dmitrievich Sasov, Moscow (RU)

(73) Assignee: R-Amtech International, Inc., Bellevue, WA (US)

(*) Notice: Under 35 U.S.C. 154(b), the term of this patent shall be extended for 0 days.

(21) Appl. No.: 09/329,360

(22) Filed: Jun. 10, 1999

(30) Foreign Application Priority Data

Jul. 7, 1998 (RU) .................................. 98112346

(51) Int. Cl.[7] .................. H01L 23/538; H01L 25/18; H01L 25/04; H01L 23/02
(52) U.S. Cl. .................. 257/712; 257/679; 257/680; 257/774; 257/723; 257/730; 257/686; 257/668; 257/720; 257/796; 257/684; 361/688; 361/831; 361/717; 361/711; 361/709
(58) Field of Search ........................ 257/686, 685, 257/679, 680, 774, 723, 712, 713, 675, 673, 684, 796, 787, 788, 720, 730, 668, 784; 361/688, 709, 711, 717–719, 723, 831

(56) References Cited

U.S. PATENT DOCUMENTS

| 4,447,716 | * | 5/1984 | Aigo ..................................... 235/492 |
| 4,611,882 | | 9/1986 | Ushida ................................. 361/303 |
| 5,067,008 | * | 11/1991 | Yanaka et al. ........................ 257/703 |
| 5,736,781 | * | 4/1998 | Atsumi ................................. 257/679 |
| 5,821,457 | * | 10/1998 | Mosley et al. ........................ 174/52.4 |
| 5,963,796 | * | 10/1999 | Kim ...................................... 438/125 |
| 5,974,504 | * | 10/1999 | Lee et al. .............................. 711/115 |
| 5,982,030 | * | 11/1999 | MacIntrye ............................ 257/701 |
| 5,986,341 | * | 11/1999 | Usami et al. ......................... 257/723 |
| 5,998,860 | * | 12/1999 | Chen et al. ........................... 257/679 |
| 5,998,865 | * | 12/1999 | Akram .................................. 257/723 |
| 6,013,948 | * | 1/2000 | Akram et al. ......................... 257/680 |
| 6,072,122 | * | 6/2000 | Hosiya ................................. 257/723 |

FOREIGN PATENT DOCUMENTS

| 675 323 A5 | 9/1990 | (CH) . |
| 25 53 643 B2 | 8/1976 | (DE) . |
| 33 01 673 A1 | 7/1984 | (DE) . |
| 35 23 061 A1 | 1/1987 | (DE) . |
| 39 10 699 A1 | 10/1990 | (DE) . |

(List continued on next page.)

OTHER PUBLICATIONS

IBM Technical Disclosure Bulletin, vol. 38, No. 06, Jun. 1995.
Data sheet of Taiyo Yuden Co., Ltd. 1993.
"Design and Calculation of Large Scale Integration Hybrid IC, Microassemblies and Apparatus and Apparatus Based in Them", B.F. Visotski, Moscow, Radio and Comm., 1981, p. 125–126.
A.P. Nenashev and L.A. Koledov "Fundamentals of Micro--Electronic Apparatus Design", Moscow, Radio and Comm., 1981., pp. 258–261, Fig. 7.10.

(List continued on next page.)

Primary Examiner—Alexander O. Williams
(74) Attorney, Agent, or Firm—Birch, Stewart, Kolasch & Birch, LLP

(57) ABSTRACT

A double-sided electronic device includes a heat conductive substrate having working zones of structures and components disposed thereon in double planar arrangement, as a monolithic or hybrid electronic device. In order to connect the structures or components, disposed on different sides of a substrate, connecting conductors go through the substrate's edges. At the same time the connecting conductors are insulated from the structures and pass on main surfaces of double-sided electronic device. In a case of failure detection after burn-in and checking, the device having one good side is used as conventional, housed in a package or three-dimensional module. A device having two good surfaces has double information capacity. The invention provides a large economic benefit due to economy of materials and significantly increases a packing density of electronic equipment.

15 Claims, 3 Drawing Sheets

FOREIGN PATENT DOCUMENTS

| | | |
|---|---|---|
| 39 34 224 A1 | 1/1991 | (DE) . |
| 42 34 506 A1 | 4/1993 | (DE) . |
| 42 38 555 A1 | 2/1994 | (DE) . |
| 42 39 761 A1 | 6/1994 | (DE) . |
| 44 21 319 A1 | 12/1995 | (DE) . |
| 0465196A2 | 1/1992 | (EP) . |
| 0 681 330 A2 | 11/1995 | (EP) . |

OTHER PUBLICATIONS

McGraw–Hill Publication "Electronics" The Worldwide Technology Weekly, Mar. 17 1986, vol. 59 No. 11, p. 3 and 28.

Japanese Patent Abstract "Leadless Module Substrate" May 2 1997, Pub. No. 09116089A.

* cited by examiner

DOUBLE-SIDED ELECTRONIC DEVICE

BACKGROUND OF THE INVENTION

The present invention relates to an area of creating monolithic and hybrid electronic devices having high component packing densities and increased density of interconnections, more particularly, to construction of double-sided electronic devices.

A known construction of stackable flex packaging of chips is disclosed by IBM (Technical Disclosure Bulletin, vol.38, #06 June 1995).

Semiconductor chips are connected, forming a linear array, and are mounted on the both sides of a flexible tape. In addition, flexible wiring may be folded to form a stack. Thermally conductive tape or potting compound may be used to hold the stack of the chips and leads may be brought out of the stack for connection in a next level. Wider tape having several rows of chips similarly disposed may be used for larger chip packages.

A construction of dynamic RAM modules is also taught by a data sheet of Taiyo Yuden Co, Ltd, 1993. Microcircuits having J-leads and "gull wing" leads are mounted on the both sides of a printed circuit board (PCB), having external leads. In this case a thickness of the assembly is 8.89 and 6.5 mm.

In both cases an effort is made to raise the packing density by disposal of electronic components on both sides of a commutation board. But using packaged components and disposing them on both sides of the board make this method of low effectiveness because of the large thickness of the packages. Besides, a process of apparatus automated assembling and repair becomes more complicated because of a necessity of providing common assembly heating and maintaining its integrity.

A known construction of a double-sided electronic cell is described in the book "Design and Calculation of Large Scale Integration Hybrid IC, Microassemblies and Apparatus Based on Them", editor B. F. Visotski, Moscow, Radio and Comm., 1981, p. 126, FIG. 3.11.

A construction of the cell is described having several unpackaged microassemblies, disposed on opposite sides of a printed circuit commutation insert. This method provides a packing density raised by 2 times and a specific power dissipation increased by 1.5–2 times.

A similar construction of a functional group, being a part of a fourth generation apparatus and comprising unpackaged IC, is described in a book by A. P. Nenashev and L. A. Koledov "Fundamentals of Micro-Electronic Apparatus Design", Moscow, Radio and Comm., 1981, p. 261, FIG. 7.10.

The common shortcomings of these constructions are complexity of apparatus assembly and repair and also increased dimensions because of the arrangements of the unpackaged electronic components on the commutation boards' surfaces.

A known technical solution of a power semiconductor circuit is disclosed in German Patent DE 4238555 A1 H01L, dated Feb. 3, 1994

An integrated circuit is proposed for power semiconductor equipment, which contains power semiconductor devices and a control chain, implemented in a single semiconductor module. Applications of the module are coils AC driving and bipolar power suppliers; additionally, semiconductor devices are disposed on opposite sides of an insulating substance and connected to each other electrically by a through channel, passing through the substance.

A construction of a microwave assembly is known according to a German Patent DE 3934224 A1 H01L, 27/13 dated Jan. 10, 1991.

A microwave assembly device with a high frequency circuit is patented, implemented on a top surface of an insulating substrate with active elements and conductors. In accordance with the invention a circuit is provided comprising integral power supply elements and decoupling high frequency elements, which are disposed on opposite sides of the substrate. Elements disposed on the opposite side are connected by through contacts.

An advantage of both these last solutions is provided by the double-sided disposal of active and passive elements on surfaces of insulating bases and their electrical connection by through contacts.

Shortcomings are that they are schematic solutions without constructive elements, which do not allow one to apply the solutions in electronic apparatus, and also they provide a complexity of fabrication and impossibility of repair.

Also known is a technical solution according to an article "The Latest Wafer-Scale Design is a Hybrid" (Electronics, 1986, #11, p.28).

In this construction an IC die is disposed in an aperture made in a silicon wafer and is held in it by a polyimide or epoxy compound. The die's active zone is disposed in this case practically on a plane with connecting conductors. An advantage of this construction is derived from the component's disposal inside a commutation board's body.

Shortcomings are single-sided planar disposal of the IC die operating surfaces and also complexity of heat removal and difficulties connected with a difference in TCLE (Temperature Coefficient of Linear Expansion) of the die and compound materials.

Nonetheless, the technical solution in the article "The Latest Wafer-Scale Design is a Hybrid" is the closest analogue of the present invention.

It is apparent from the above analysis that a main problem in creating modern electronic apparatus is obtaining maximum possible packing density while maintaining or improving other technical/economical characteristics.

It is an object of this invention to provide a newinprinciple electronic device using both surfaces of a semiconductor substrate or a microboard's substrate for having components working zones thereon. Additionally it is an object of this invention to provide economy of high cost materials (especially pure monocrystalline silicon, heat conductive ceramics etc.); to simplify layouts between structures and components; and to simplify monolithic and hybrid IC fabrication technology.

SUMMARY OF THE INVENTION

According to principles of the invention, a doublesided electronic device, includes a heat conductive substrate in the form of a plane plate, with active and/or passive components or other structures disposed inside its body, the substrate having at its periphery connecting bonding pads, going out to the substrate's edges, with, according the invention, working zones of active and/or passive components or structures on both sides of the substrate, forming common planes for disposed connecting conductors (double planar).

If there is, at least, one volume unpackaged electronic component as a part of the double-sided device, it is disposed in a window or in a cavity of the device's substrate and has heat, electric and mechanical contact ith the substrate by conductors connecting the volume unpackaged electronic component with the substrate; additionally it is advisable to implement the conductors using thin film technology. If it is necessary, a thickness of the conductors can be increased using, for example, galvanic or chemical deposition or hot soldering.

The volume unpackaged component can have heat contact with the substrate through the window's or cavity's walls along with component's edges through heat conductive material disposed in a gap between the component and the cavity or the window of the device's substrate. In this case, if the heat conductive material is electric-conductive, electrical non-protected zones of the component and window or cavity are preliminarily deposited with an insulating cover. This method is highly effective because it allows a reducton of a thermal resistance between the components and substrate to fractions of EC per watt of dissipated power.

It is advisable to dispose on one surface of the substrate common connecting pads, having electrical connection with structures and/or components on the both sides of the substrate. This can be realized by using the substrate's edges for laying connecting conductors between the device's surfaces.

A topology of the structures disposed on the other sides of monolithic substrate is projected mainly applying common technological process of device fabrication, and also calculating a minimum quantity and a minimal length of connections between both sides of the device. The common technology gives significant economic benefit, because it allows, during implementation of many operations, simultaneous processing of both sides of the double-sided electronic device.

The device's substrate can be of an electric conductive material having deposited thereon an insulating layer (for example, of anodized aluminum or its alloys), or of a semiconductor material with a selectively deposited insulating layer (for example, of monocrystalline silicon with silicon oxynitride layer), or of an insulating material (for example, ceramics).

When the device is housed in a conventional package, it is turned to a side so that common connecting bonding pads contact with a leads frame or leads of the package, and a layer of heat conductive insulating material, having a minimum thickness, is disposed between the device and the package.

In the case of independent application of the double-sided electronic device, or if it is a part of a three-dimensional module comprising a plurality of the devices, external leads of the device, mainly as flat figured girders, are disposed, at least, on one of the device's surfaces, these leads having direct electrical and mechanical contact with common connecting bonding pads of the device. Additionally the external leads are preliminarily insulated at places of their possible contact with the structures and/or conductors disposed on the device's surfaces. In this case the external leads practically occupy no space, and if the device is applied in a three-dimensional module using capillary soldering for the devices connections one to another, a distance between the devices is inherently sustained.

One or both of the surfaces of the double-sided electronic device must contain an electric insulating layer with open windows at places of contact with the electronic components and/or structures, if there are conductors connecting components and/or structures with common connecting bonding pads over the layer. Additionally, bonding pads, relating to any structure or component, can be disposed at any place on both surfaces of the double-sided electronic device. This means that, in the case of applying a conventional IC structure, it is not necessary to dispose bonding pads at its periphery—they can be disposed at any place on the structure. Additionally, it is necessary to avoid parasitic capacitance between the device's structures and connecting conductors.

In a case of detecting, after burn-in and checking, a failed electronic component or structure, a failed area is isolated by eliminating its contact with common connecting bonding pads of the device, for example, by laser burning the conductors. In this case the device, with one good side, is used as a conventional one-sided device for being housed in a conventional package or three-dimensional module; also it can be used as a partially good double-sided device.

This method gives a large economic benefit, because only devices, having failed both sides cannot be employed, but a quantity of them is small.

BRIEF DESCRIPTION OF THE DRAWINGS

The invention being proposed is explained below by concrete examples of its implementation and supplied figures. The described and drawn features can be used, individually or in preferred combinations, in other embodiments of the invention. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DETAILED DESCRIPTION OF THE INVENTION

Figure 1C:
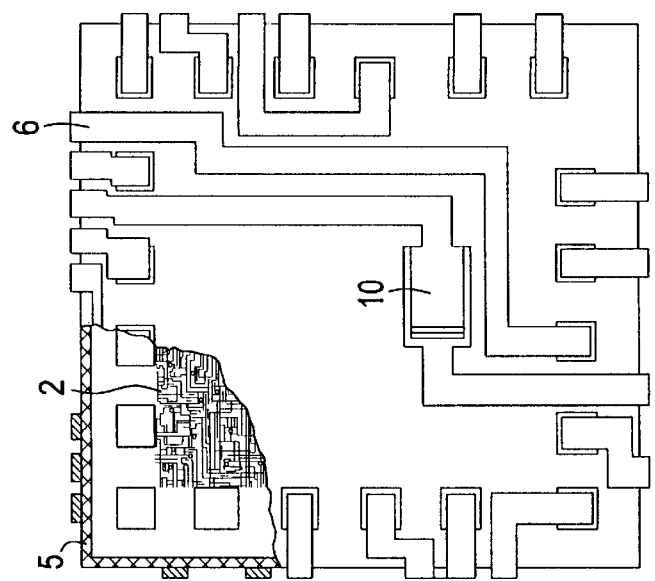
FIGS. 1A, 1B and 1C are respectively top, side and bottom cutaway views showing a variant of a monolithic double-sided electronic device of this invention.
Figure 1B:
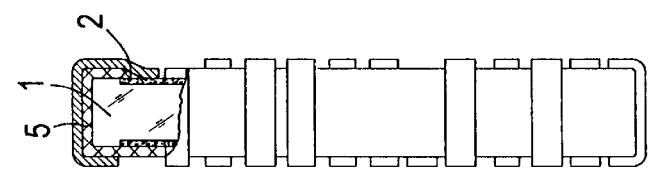
Figure 1A:
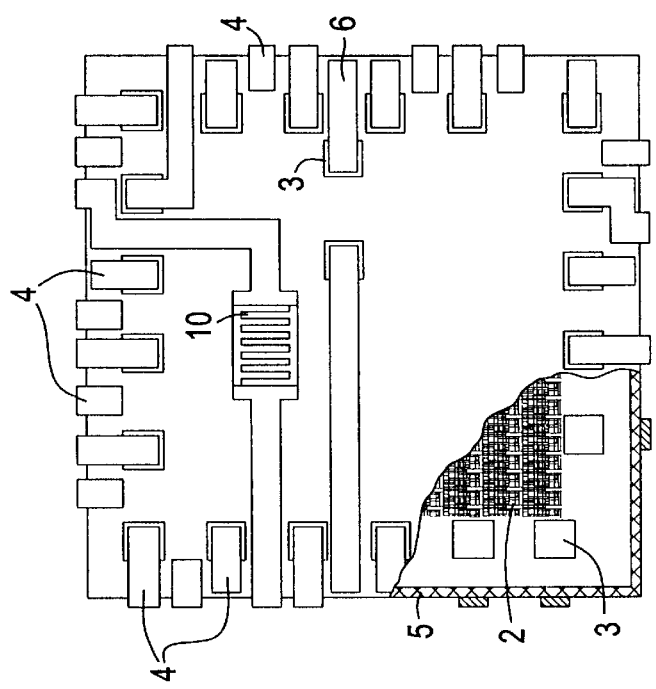

A monolithic double-sided electronic device (FIGS. 1A, 1B and 1C) includes a substrate 1 of semiconductor material and structures 2. The substrate 1 has bonding pads 3, disposed at arbitrary places of the structures 2. The structures 2 are disposed on both sides of the monolithic double-sided electronic device, the monolithic double-sided electronic device having along its periphery commonly connected bonding pads 4, connected with structures and components by conductors rounding edges of the monolithic double-sided device. The structures 2 and non-insulated parts of the substrate 1 are covered by an insulating layer 5 with opened apertures at the bonding pads 3. The bonding pads 3 are connected with common output bonding pads 4 by conductors 6, disposed over the insulating layer 5.

Figure 2C:
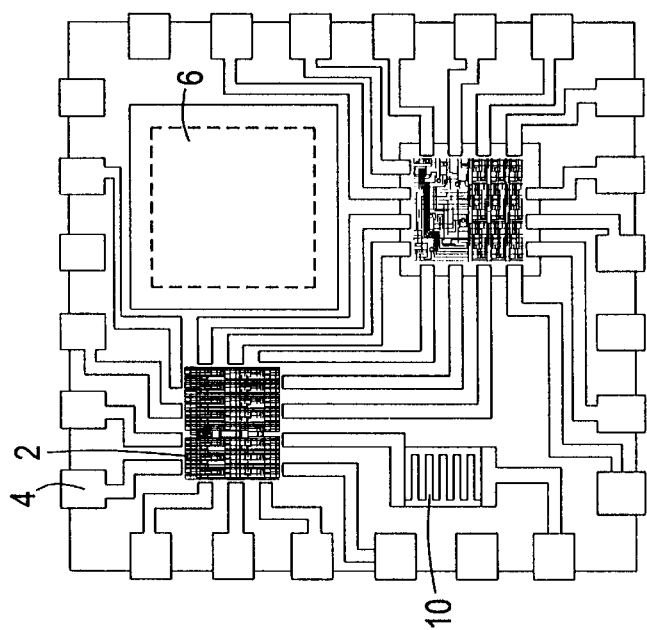
FIGS. 2A, 2B and 2C are respectively top, side sectional and bottom views showing another variant of a hybrid double-sided electronic device embodiment.

A hybrid double-sided electronic device (FIGS. 2A, 2B AND FIG. 2C) includes a substrate 1 with windows and cavities 7 for disposal of unpackaged components 8.

Figure 2B:
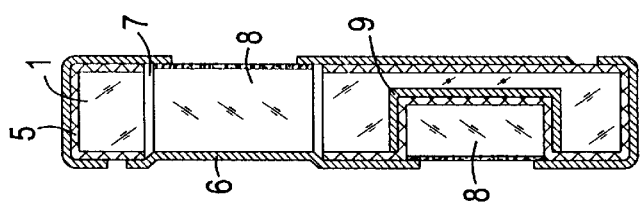
Figure 2A:
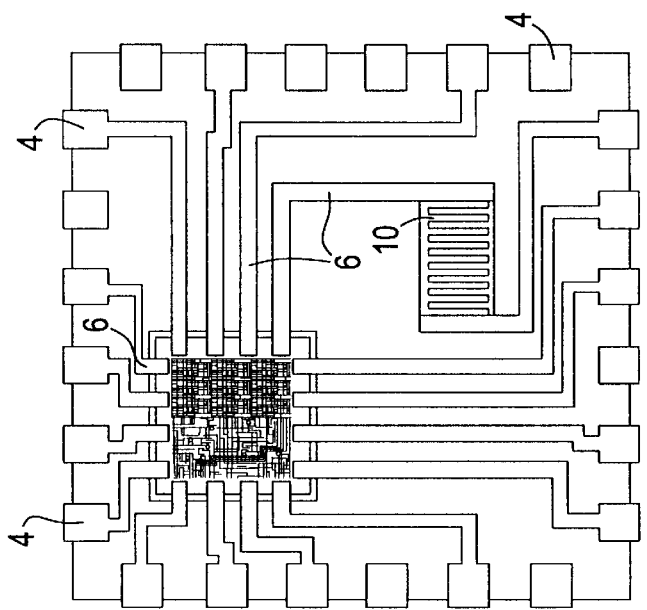

In this case working surfaces of the unpackaged components 8 are coplanar with surfaces of the substrate 1. As is shown in an upper fragment of the cross-section of FIG. 2B, the unpackaged component 8 is disposed in the window 7, with a gap between them, and has heat, mechanical and electrical contact with the substrate 1 only through conductors 6, which can be disposed on both sides of the unpackaged component 8. In this case the conductors, disposed on a non-working side of the unpackaged component 8 serve mainly for heat removal. In a lower fragment of the cross-section of FIG. 2B is shown a variant for filling a gap between an unpackaged component 8 and a cavity with a heat conductive material 9, additionally, the unpackaged component 8 has its working surface turned to an opposite surface of the substrate 1, which significantly simplifies a layout of conductors 6 over the surface of the substrate 1. If the heat conductive material 9 possesses a high electric conductivity (for example, solder as the heat conductive material), it is insulated from the unpackaged component 8 by an insulating layer 5. If the substrate 1 is of semiconductor or electronic conductive material, it is also selectively covered by the insulating layer 5.

Film components 10, made by thin film or thick film technology and also semiconductor structures 2 (in the case when the substrate is made of semiconductor materials) can be disposed on the surface of the substrate 1. In this variant of the hybrid double-sided electronic device the conductors 6 not only connect the unpackaged components 8 and film components 10 with common connecting bonding pads 4, but also provide connections between the components.

Figure 3:
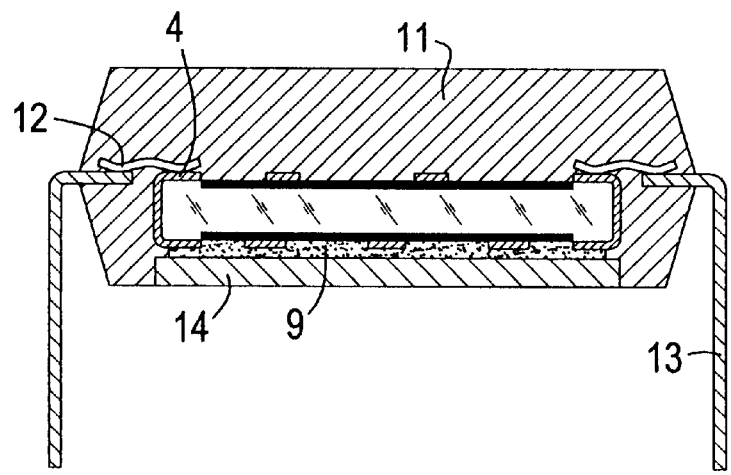
FIG. 3 is a side sectional view showing an example of a double-sided electronic device housed in a conventional package.

When housing a double-sided electronic device in a conventional package 11 (FIG. 3) it may be necessary to have all common output bonding pads 4, on one of the surfaces of the double-sided electronic device for being contacted, for example, by wire leads 12 to external leads 13 of the package 11. In this case a surface of the double-sided electronic device, adjacent a heat spreader 14 of the package 11, must be covered by an insulating layer of heat conductive material 9, having a minimum thickness.

Figure 4A:
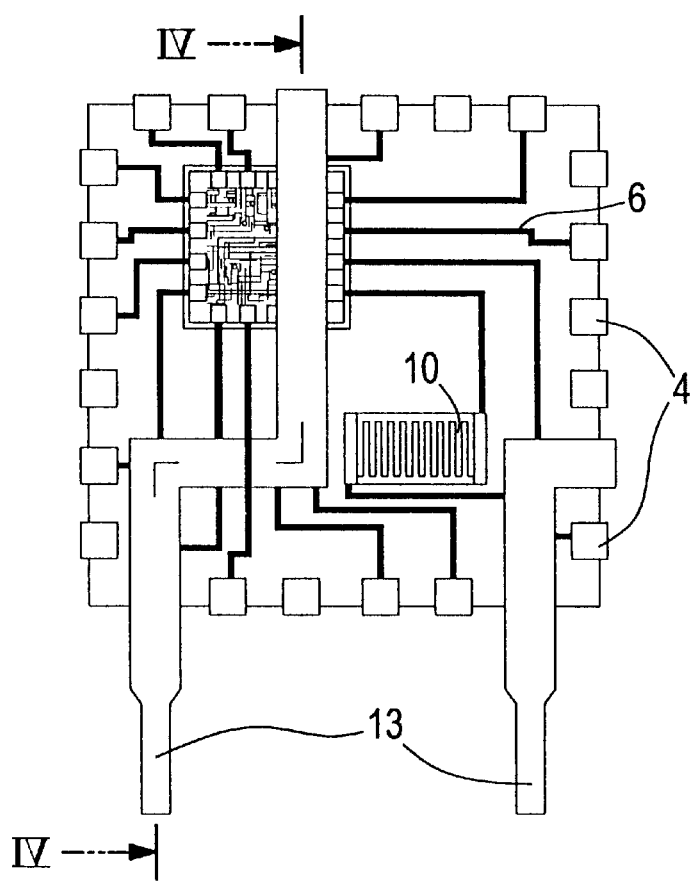
FIGS. 4A and 4B are top and side sectional views showing an example of an external lead arrangement for a double-sided electronic device of this invention, the sectional view of FIG. 4B being taken on line IV—IV in FIG. 4A.
Figure 4B:
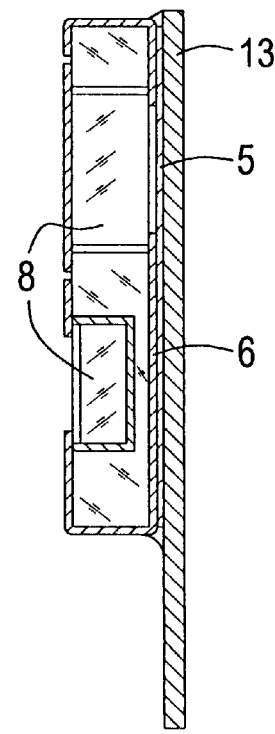

The external leads 13 can be a part of the double-sided electronic device (FIGS. 4A and 4B). In this case the external leads 13 are implemented as flat formed girders; additionally the external leads 13 have direct electric contact, for example, by soldering, with the common connecting bonding pads 4 of the double-sided electronic device. If it is necessary, a side of the external lead 13, adjacent to working surfaces of the double-sided electronic device or to the conductors 6, must be protected by an insulating layer 5.

If the double-sided electronic device is applied as a part of a three-dimensional module, a thickness of the external leads 13 is selected equal to a gap between conjugated double-sided electronic devices.

The present invention allows a significant increase in information capacity and packing density on a die without increasing its dimensions and develops technology accuracy. Further, it produces significant economy due to decreasing application of silicon and other materials.

The invention can be used in the following applications:
1. Developing and fabricating electronic devices for any kind of electronic apparatus, raising a packing density by several times and reducing a total cost of apparatus fabrication.
2. Creating extremely dense constructions of three-dimensional modules for air/space and other special apparatus.
3. In medical equipment, for creating tiny systems of diagnostics and treatment.
4. In telecommunications systems, for making super-tiny transceivers.
5. Fabricating tiny consumer apparatus having essentially new consumer properties.
6. In industrial and consumer security systems.

References
1. IBM Technical Disclosure Bulletin. Vol.38, #06, June 1995.
2. Taiyo Yuden Co, Ltd., 1993. Data sheet
3. "Design and Calculation of Large Scale Integration Hybrid IC,
   Microassemblies and Apparatus Based on Them", editor B. F. Visotski, Moscow,
   Radio and Comm. 1981.
4. A. P. Nenashev and L. A. Koledov. "Fundamentals of Micro-Electronic
   Apparatus Design". Moscow, Radio and Comm, 1981.
5. "The Latest Wafer-Scale Design is a Hybrid". Electronics, 1986, #11, p.28.
6. Patent of Germany DE 3934224 A1 HO1L 27/13, dated Jan. 10, 1991.
7. Patent of Germany DE 4238555 A1 HO1L 25/065, dated Feb. 3, 1994.

I claim:
1. Double-sided electronic device comprising a heat-conductive substrate formed as a plate, there being semiconductor structures and other electronic components mounted on each of opposite sides of the heat-conductive substrate, wherein there is at least one common connecting bonding pad disposed at a peripheral edge of the heat conducting substrate, said common connecting bonding pad being electrically coupled to electrical components on both sides of the heat-conductive substrate, said common connecting bonding pad including a conductive portion rounding a peripheral edge on the monolithic heat-conductive substrate.

2. The double-sided electronic device of claim 1, wherein the heat-conductive substrate is a monolithic semiconductor plate.

3. The double-sided electronic device according to claim 1, wherein the heat-conductive substrate is mainly of an electric insulating material, and wherein at least one side of the heat-conductive substrate has a substrate cavity therein and one of said electronic components is an unpackaged electronic component disposed in the substrate cavity to have heat, mechanical and electric contact with the substrate by a conductor connection to a bonding pad on the substrate.

4. The double-sided electronic device according to claim 1, wherein the heat-conductive substrate is mainly of electric insulated material and wherein there is a substrate window opening in the heat-conductive substrate extending between opposite sides of the heat-conductive substrate, and wherein one of said electronic components is an unpackaged electronic component disposed in the substrate window to have heat, mechanical and electric contact with the substrate by a conductor connecting a working side of the one electronic component with a bonding pad on the substrate and additionally having a heat-removal and mechanical-fastening heat conductor connecting a non-working side of the unpackaged component to the substrate.

5. The double-sided electronic device according to claim 1, wherein a topology of electronic structures disposed on each of the opposite sides of the heat-conductive substrate is oriented to the topology of the other side so that a minimum quantity and length of connections between the two opposite sides is necessary.

6. The double-sided electronic device according to claim 1, wherein at least one side of the heat-conductive substrate has a substrate cavity therein and there is at least one unpackaged electronic component disposed in the substrate cavity, said unpackaged electronic component having a heat-conductive contact with the substrate at peripheral edges of the unpackaged component through heat-conductive material disposed in a gap between the peripheral edges of the unpackaged component and substrate-cavity walls forming the substrate cavity.

7. The double-sided electronic device according to claim 1, wherein the heat-conductive substrate is of electric conductive material with a deposited insulative layer thereon.

8. The double-sided electronic device according to claim 1, wherein at least one of the heat-conductive substrate's surfaces contains film components.

9. The double-sided electronic device according to claim 1, wherein the opposite sides of the heat-conductive substrate lie in parallel planes and wherein the bonding pads are disposed at any place on both planes.

10. The double-sided electronic device according to claim 1, wherein at least one electronic conductor on at least one of the opposite sides of the heat-conductive substrate is electrically coupled to an external lead with said external lead being formed as a substantially flat girder, having direct electric and mechanical contact with said common connecting bonding pad, said flat girder lying on said heat-conductive substrate and at least one of said electronic components, but being insulated from said electric components.

11. The double-sided electronic device according to claim 1, wherein the heat-conductive substrate is mainly of an electric insulating material, and wherein at least one side of the heat-conductive substrate has a substrate cavity therein and one of said electronic components is an unpackaged electronic component disposed in the substrate cavity to have heat, mechanical and electric contact with the substrate; and wherein there is an electric insulating cover between the unpackaged electric component and walls forming the substrate cavity at places where the unpackaged electronic component is attached to walls forming the cavity by a heat-conductive material.

12. The double-sided electronic device according to claim 1, wherein the heat-conductive substrate is mainly of electric insulated material and wherein there is a substrate window opening in the heat-conductive substrate extending between opposite sides of the heat-conductive substrate, and wherein one of said electronic components is an unpackaged electronic component disposed in the substrate window to have heat, mechanical and electric contact with the substrate; and wherein said unpackaged electronic component has heat contact with the substrate at edges of the unpackaged electronic component by heat-conductive material disposed in a gap between the unpackaged electronic component and walls forming the window of the substrate.

13. The double-sided electronic device according to claim 12, wherein there is an electric insulating cover between the unpackaged electronic component and walls forming the window at places where there is heat-conductive connection between the unpackaged electronic component and the walls forming the window.

14. A package including a housing containing the double-sided electronic device according to claim 1, wherein the device is turned in the housing of the package so that its common connecting bonding pads face a side for contacting leads of the package, and a layer of heat-conductive electric insulating material, having a minimum thickness, is inserted between the device and the package.

15. A method of employing the double-sided electronic device of claim 1, comprising the steps of, checking and detecting, after burn-in, a failed area of a failed component, isolating the failed area by eliminating its contact with common connecting bonding pads of the device, further using the device as a one-sided or two-sided device.

* * * * *